(12) United States Patent
Zhao et al.

(10) Patent No.: US 11,049,917 B2
(45) Date of Patent: Jun. 29, 2021

(54) OLED DISPLAY PANEL, A METHOD FOR FABRICATING THE SAME, AND A DISPLAY DEVICE

(71) Applicants: Hefei BOE Optoelectronics Technology Co., Ltd., Anhui (CN); BOE Technology Group Co., Ltd., Beijing (CN)

(72) Inventors: Na Zhao, Beijing (CN); Liyun Deng, Beijing (CN); Bin Zhou, Beijing (CN)

(73) Assignees: Hefei BOE Optoelectronics Technology Co., Ltd., Anhui (CN); BOE Technology Group Co., Ltd., Beijing (CN)

( * ) Notice: Subject to any disclaimer, the term of this patent is extended or adjusted under 35 U.S.C. 154(b) by 31 days.

(21) Appl. No.: 16/494,359

(22) PCT Filed: Mar. 18, 2019

(86) PCT No.: PCT/CN2019/078568
§ 371 (c)(1),
(2) Date: Sep. 16, 2019

(87) PCT Pub. No.: WO2019/196601
PCT Pub. Date: Oct. 17, 2019

(65) Prior Publication Data
US 2021/0050394 A1    Feb. 18, 2021

(30) Foreign Application Priority Data
Apr. 12, 2018  (CN) .................. 201810325718.6

(51) Int. Cl.
*H01L 27/32*  (2006.01)
*H01L 51/52*  (2006.01)
*H01L 51/56*  (2006.01)

(52) U.S. Cl.
CPC ........ *H01L 27/3246* (2013.01); *H01L 27/322* (2013.01); *H01L 51/5228* (2013.01);
(Continued)

(58) Field of Classification Search
CPC ............... H01L 27/3246; H01L 27/322; H01L 27/3258; H01L 27/3248; H01L 51/5228;
(Continued)

(56) References Cited

U.S. PATENT DOCUMENTS 7,667,232 B2 * 2/2010 Hirai ................... H01L 27/1292
257/59
8,188,950 B2 * 5/2012 Hasegawa ............ G09G 3/3283
345/84
(Continued)

FOREIGN PATENT DOCUMENTS

| CN | 101656263 A | 2/2010 |
|---|---|---|
| CN | 103545345 A | 1/2014 |

(Continued)

OTHER PUBLICATIONS

Office Action for corresponding Chinese Application 201810325718.6 dated Mar. 26, 2019.
(Continued)

*Primary Examiner* — Nikolay K Yushin
(74) *Attorney, Agent, or Firm* — Arent Fox LLP; Michael Fainberg (57) ABSTRACT

This disclosure relates to the field of display technologies, and discloses an OLED display panel, a method for fabricating the same, and a display device, and the OLED display device includes: a first substrate; a pixel definition layer located on the first substrate, and including a plurality of hollow light-emitting areas, and first recessed sections located between adjacent light-emitting areas; a cathode layer located on a side of the pixel definition layer away from the first substrate, and comprising corresponding sec- (Continued)

ond recessed sections corresponding in position to the first recessed sections; and electrically conductive sections located on a side of the cathode layer away from the pixel definition layer, and located in the second recessed sections.

16 Claims, 7 Drawing Sheets

(52) U.S. Cl.
CPC .......... *H01L 51/5284* (2013.01); *H01L 51/56* (2013.01); *H01L 2227/323* (2013.01); *H01L 2251/5315* (2013.01)

(58) Field of Classification Search
CPC ................. H01L 51/5284; H01L 51/56; H01L 2251/5315; H01L 2251/301; H01L 2251/5238; H01L 2251/5392; H01L 2227/323
See application file for complete search history.

(56) References Cited

U.S. PATENT DOCUMENTS

| | | | |
|---|---|---|---|
| 2006/0078830 A1* | 4/2006 | Hirai | .................. H01L 27/1292 430/320 |
| 2007/0194699 A1 | 8/2007 | Lee et al. | |
| 2008/0143656 A1* | 6/2008 | Hasegawa | ............ G09G 3/3283 345/84 |
| 2010/0231124 A1 | 9/2010 | Song | |
| 2014/0312329 A1 | 10/2014 | Fujii et al. | |
| 2016/0035980 A1 | 2/2016 | Kong et al. | |
| 2016/0181566 A1 | 6/2016 | Wang | |
| 2016/0233458 A1 | 8/2016 | Shen et al. | |
| 2016/0351649 A1 | 12/2016 | Li | |

FOREIGN PATENT DOCUMENTS

| | | |
|---|---|---|
| CN | 103715231 A | 4/2014 |
| CN | 103972270 A | 8/2014 |
| CN | 203812883 U | 9/2014 |
| CN | 104112762 A | 10/2014 |
| CN | 104882463 A | 9/2015 |
| CN | 108539043 A | 9/2018 |
| JP | 2007108469 A | 4/2007 |

OTHER PUBLICATIONS

Office Action for corresponding Chinese Application 201810325718.6 dated Aug. 26, 2019.

* cited by examiner

OLED DISPLAY PANEL, A METHOD FOR FABRICATING THE SAME, AND A DISPLAY DEVICE

This application is a national stage of International Application No. PCT/CN2019/078568, filed on Mar. 18, 2019, claiming priority to Chinese Patent Application No. 201810325718.6, filed with the Chinese Patent Office on Apr. 12, 2018, and entitled "An OLED display panel, a method for fabricating the same, and a display device", the contents of each of which are hereby incorporated by reference in their entireties.

FIELD

This disclosure relates to the field of display technologies, and particularly to an OLED display panel, a method for fabricating the same, and a display device.

BACKGROUND

Organic Light-Emitting Diode (OLED) display devices have the advantages of self-emission, a high response speed, high brightness, high saturation, a low weight, a small thickness, etc., over liquid crystal display devices, and are recognized as the next generation of display technology. The OLED display devices can include a bottom-emitting OLED display device (where light is emitted downward relative to a substrate), a top-emitting OLED display device (where light is emitted upward relative to a substrate), and a bottom- and top-emitting transparent OLED display device.

Particularly an array substrate of the top-emitting OLED display device includes metal anodes, metal cathodes, and an organic layer located between the metal anodes and the metal cathodes, etc., where light emitted by the organic layer exits the array substrate from the metal cathode side. Since the cathode layer is typically made of single metal and/or alloy metal with a low work function, there is a low transmittivity thereof of light. In order to alleviate the cathode layer from degrading the overall light exit ratio of the top-emitting OLED display device, the thickness of the cathode layer shall be made small. The anode layer shall be made of a reflecting metal material to thereby further improve the transmittivity of light. However there are larger resistances of block resistors of the cathode layer with a smaller thickness, so there are serious voltage drops in the top-emitting OLED display device, and thus there are more pronounced voltage drops across light-emitting faces of OLEDs further to a power supply, i.e., driving transistors connected with the anode layer, thus resulting in a pronounced phenomenon of non-uniform emitted light in the top-emitting OLED display device. Moreover, there are such a high resistance of the metal cathode that both the metal cathode and the metal anode shall consume much power to drive the organic layer to emit light, thus radiating considerable heat, and easily hindering the array substrate from operating normally.

SUMMARY

An embodiment of this disclosure provides an OLED display panel including: a first substrate; a pixel definition layer located on the first substrate, the pixel definition layer including a plurality of hollow light-emitting areas, and first recessed sections located between adjacent light-emitting areas; a cathode layer located on a side of the pixel definition layer away from the first substrate, the cathode layer including corresponding second recessed sections corresponding in position to the first recessed sections; and electrically conductive sections located on a side of the cathode layer away from the pixel definition layer, and located in the second recessed sections.

In a possible implementation, the first recessed sections are formed by etching the pixel definition layer.

In a possible implementation, the pixel definition layer further includes blocking sections located between the first recessed sections and the light-emitting areas; and a depth of the first recessed sections is a half of a thickness of the blocking sections.

In a possible implementation, the OLED display panel further includes a passivation layer located between the first substrate and the pixel definition layer; there are third recessed sections at the passivation layer at positions corresponding to the first recessed sections; and the first recessed sections are formed by recessing the pixel definition layer at the third recessed sections.

In a possible implementation, the OLED display panel further includes a passivation layer located between the first substrate and the pixel definition layer; there are third recessed sections at the passivation layer at positions corresponding to the first recessed sections; and the first recessed sections are formed by recessing the pixel definition layer at the third recessed sections, and etching the pixel definition layers at the positions.

In a possible implementation, the OLED display panel further includes: thin film transistors located between the first substrate and the passivation layer; anodes located between the passivation layer and the pixel definition layer; and an organic function layer located between the pixel definition layer and the cathode layer.

In a possible implementation, a thickness of the electrically conductive sections is equal to a depth of the second recessed sections.

In a possible implementation, a resistivity of the electrically conductive sections is not larger than a resistivity of the cathode layer.

In a possible implementation, a material of the electrically conductive sections includes nanometer silver.

In a possible implementation, a material of the electrically conductive sections includes PEDOT/PSS or poly(3,4-ethylenedioxythiophene)/poly(styrenesulfonate).

In a possible implementation, the OLED display panel further includes a second substrate arranged opposite to the first substrate, and spacers located on a side of the second substrate facing the first substrate; and normal projections of the electrically conductive sections onto the first substrate cover normal projections of the spacers onto the first substrate.

In a possible implementation, the OLED display panel further includes an assistant electrode layer on the sides of the spacers away from the second substrate; and the assistant electrode layer contacts with the electrically conductive sections at positions corresponding to the spacers.

In a possible implementation, the OLED display panel further includes: black matrixes located between the second substrate and the spacers; a color filter layer located between the black matrix and the spacers; a planarization layer located between the color filter layer and the spacers; and a filling layer located on a side of the assistant electrode layer away from the planarization layer; normal projections of the black matrixes onto the first substrate cover normal projections of the electrically conductive sections onto the first substrate.

An embodiment of this disclosure further provides a display device including the OLED display panel according to an embodiment of this disclosure.

An embodiment of this disclosure further provides a method for fabricating the OLED display panel according to an embodiment of this disclosure, the method including: providing the first substrate; forming the pixel definition layer on the first substrate, the pixel definition layer including the plurality of hollow light-emitting areas, and the first recessed sections located between the adjacent light-emitting areas; forming the cathode layer located on the side of the pixel definition layer away from the first substrate, wherein the cathode layer includes the corresponding second recessed sections corresponding in position to the first recessed sections; and forming the electrically conductive sections in the second recessed sections.

In a possible implementation, forming the pixel definition layer on the first substrate includes: forming the pixel definition layer on the first substrate through inkjet printing.

In a possible implementation, forming the pixel definition layer on the first substrate includes: forming a pixel insulation layer on the first substrate; and masking, exposing, and etching the pixel insulation layer using a half-tone mask, wherein light-all-transmitting areas of the half-tone mask correspond in position to the light-emitting areas, and light-semi-transmitting areas of the half-tone mask correspond in position to the first recessed sections.

DETAILED DESCRIPTION OF THE EMBODIMENTS

The technical solutions according to the embodiments of this disclosure will be described below clearly and fully with reference to the drawings in the embodiments of this disclosure. Apparently, the embodiments to be described are only a part but not all of the embodiments of this disclosure. Based upon the embodiments here of this disclosure, all the other embodiments which can occur to those ordinarily skilled in the art without any inventive effort shall come into the scope of this disclosure as claimed.

Figure 1:
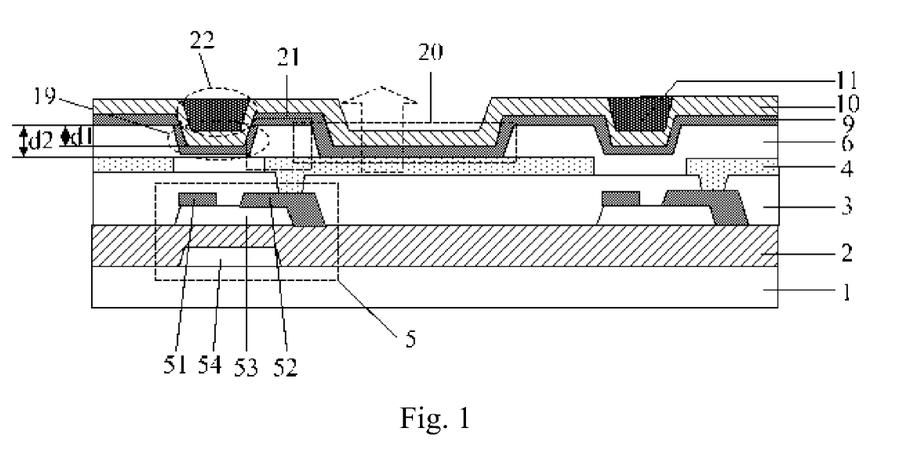
FIG. 1 is a schematic structural diagram of an OLED display device including first recessed sections formed by etching a pixel definition layer according to an embodiment of this disclosure.

As illustrated in FIG. 1, an embodiment of this disclosure provides an OLED display panel including: a first substrate 1; a pixel definition layer 6 located on the first substrate 1, and including a plurality of hollow light-emitting areas 20, and first recessed sections 19 located between the adjacent light-emitting areas 20; a cathode layer 10 located on the side of the pixel definition layer 6 away from the first substrate 1, and including corresponding second recessed sections 22 corresponding in position to the first recessed sections 19; and electrically conductive sections 11 located on the side of the cathode layer 10 away from the pixel definition layer 6, and located in the second recessed sections 22.

It shall be noted that the electrically conductive sections 11 are made of an electrically conductive material, and connected in parallel with the cathode layer 10 to thereby reduce the resistance of the cathode layer 10. The OLED display panel according to an embodiment of this disclosure particularly can be a top-emitting OLED display panel in which light rays (as denoted by the dotted arrow in FIG. 1) are emitted upward relative to the first substrate 1.

In the OLED display panel according to an embodiment of this disclosure, the electrically conductive sections 11 can be located in the second recessed sections 22 of the cathode layer 10 so that the electrically conductive sections 11 are connected in parallel with the cathode layer 10 to thereby reduce the resistance of the cathode layer 10 in the top-emitting OLED display panel, so there are smaller voltage drops at respective positions on a light-emitting face of the OLED display panel, thus improving the uniformity of light emitted by the OLED display panel. Moreover, the resistance of the cathode layer 10 can be reduced to thereby lower power consumption of the OLED display panel in this structure. Furthermore, in an embodiment of this disclosure, the electrically conductive sections 11 for reducing the resistance of the cathode layer 10 are only located in non-light-emitting areas between the adjacent light-emitting areas 20 so as not to degrade the light exit efficiency of the OLED display panel. Moreover, the electrically conductive sections 11 are arranged in the second recessed sections 22 of the cathode layer 10 so that the electrically conductive sections 11 are connected firmly with the cathode layer 10 to thereby alleviate the electrically conductive sections 11 from being disconnected from the cathode layer 10 due to their failing connection faces, so as to improve a good yield ratio.

In a particular implementation, the first recessed sections 19 of the pixel definition layer 6 according to an embodiment of this disclosure particularly can be formed by etching the pixel definition layer 6, that is, as illustrated in FIG. 1, the first recessed sections 19 are formed by etching the pixel definition layer 6. In an embodiment of this disclosure, a photolithograph process is performed on the pixel definition layer 6 to thereby form the hollow light-emitting areas 20, and the first recessed sections 19 are formed by etching the pixel definition layer 6 so that the first recessed sections 19 can be formed while the light-emitting areas 20 are being formed in the photolithograph process, that is, the first recessed sections 19 of the pixel definition layer 6 can be formed in a simple process without increasing the number of times that a mask is used.

In a particular implementation, as illustrated in FIG. 1, the pixel definition layer 6 further includes blocking sections 21 located between the first recessed sections 19 and the light-emitting areas 20, where the depth d1 of the first recessed sections 19 is a half of the depth d2 of the blocking sections 21. In an embodiment of this disclosure, since the depth d1 of the first recessed sections 19 is a half of the thickness d2 of the blocking sections 21, in a particular process, the pixel definition layer 6 can be formed in a half-mask process, that is, a half-tone mask is used, where light-all-transmitting areas of the half-tone mask correspond in position to the light-emitting areas 20 of the pixel definition layer, and light-semi-transmitting areas of the half-tone mask correspond in position to the first recessed sections 19 of the pixel definition layer, so that the first recessed sections 19 can be formed in a simple process.

In a particular implementation, as illustrated in FIG. 1, the OLED display panel according to an embodiment of this disclosure can further include: a passivation layer 3 located between the first substrate 1 and the pixel definition layer 6, thin film transistors 5 located between the first substrate 1 and the passivation layer 3, anodes 4 located between the passivation layer 3 and the pixel definition layer 6, and an organic function layer 9 located between the pixel definition layer 6 and the cathode layer 10. Each thin film transistor 5 particularly can include a gate 54, a gate insulation layer 2, an active layer 53, and a source-drain layer located on the first substrate 1 in that order, and the source-drain layer particularly can include sources 51 and drains 52. The organic function layer 9 particularly can include at least one of a hole injection layer, a hole transmission layer, a light-emitting layer, a hole blocking layer, an electron blocking layer, an electron transmission layer, or an electron injection layer.

Figure 2:
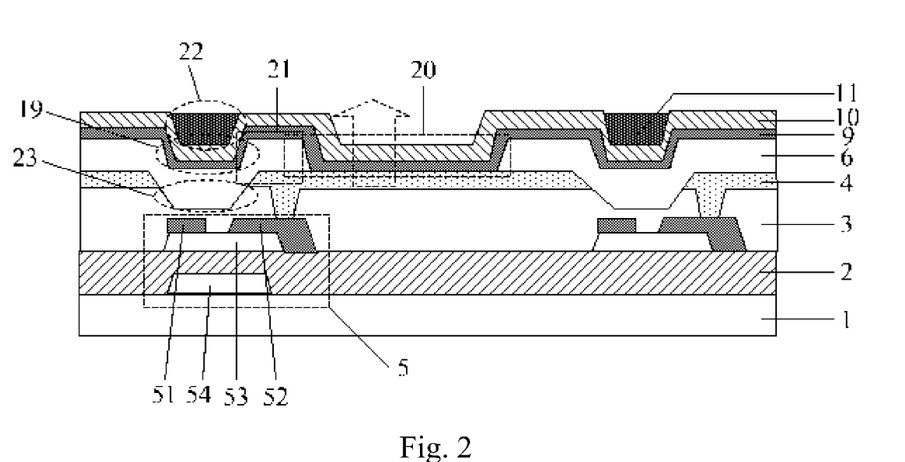
FIG. 2 is a schematic structural diagram of the OLED display device including first recessed sections formed by etching a passivation layer according to an embodiment of this disclosure.

In a particular implementation, the first recessed sections 19 of the pixel definition layer 6 in an embodiment of this disclosure particularly can be formed by etching the passivation layer 3 at the positions corresponding to the first recessed sections 19 without processing the pixel definition layer 6 at the positions corresponding to the first recessed sections 19. Since third recessed sections are formed at the underlying passivation layer 3 at the positions corresponding to the first recessed sections 19, the first recessed sections 19 naturally can be further formed at the pixel definition layer 6 at the positions corresponding to the third recessed sections. Stated otherwise, as illustrated in FIG. 2, the OLED display panel according to an embodiment of this disclosure can further include a passivation layer 3 located between the first substrate 1 and the pixel definition layer 6, where third recessed sections 23 are formed at the passivation layer 3 at the positions corresponding to the first recessed sections 19, and the first recessed sections 19 are formed by recessing the pixel definition layer 6 at the third recessed sections 23. In an embodiment of this disclosure, after the thin film transistors 5 are formed on the first substrate 1 in the OLED display panel, the passivation layer 3 is typically formed on the thin film transistors 5 to cover them, and in order to connect the thin film transistors 5 with the structures above the passivation layer 3, the passivation layer 3 is typically etched into a pattern, and the passivation layer 3 is patterned by etching the passivation layer 3 at the positions corresponding to the first recessed sections 19 without processing the pixel definition layer 6 at those positions, so that the first recessed sections 19 are formed at the pixel definition layer 6 at those positions in a simple process in an embodiment of this disclosure without increasing the number of times that a mask is used. Of course, it shall be appreciated that both the third recessed sections 23 and the first recessed sections 19 are located in areas corresponding to the areas between the adjacent light-emitting areas 20, and these positions are also the positions of the thin film transistors 5, so the passivation layer 3 shall be etched to form the third recessed sections 23, while avoiding the thin film transistors 5 from being etched, that is, the passivation layer 3 further includes thin film transistor blocking sections between the thin film transistors 5 and the third recessed sections 23 to thereby avoid the structures of the thin film transistors from being affected when the anodes are subsequently formed.

Figure 3:
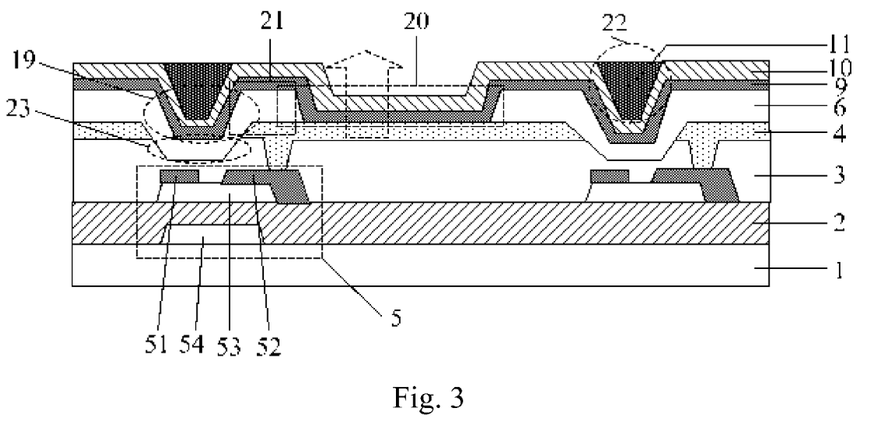
FIG. 3 is a schematic structural diagram of the OLED display device including first recessed sections formed by etching a pixel definition layer and a passivation layer according to an embodiment of this disclosure.

In a particular implementation, in the OLED display panel according to an embodiment of this disclosure, particularly the first recessed sections 19 of the pixel definition layer 6 can alternatively be formed by etching the passivation layer 3 at the positions corresponding to the first recessed sections 19, and also etching the pixel definition layer 6 at those positions. Stated otherwise, as illustrated in FIG. 3, the OLED display panel according to an embodiment of this disclosure can further include a passivation layer 3 located between the first substrate 1 and the pixel definition layer 6, where the passivation layer 3 includes third recessed sections 23 corresponding in position to the first recessed sections 19, and the first recessed sections 19 are formed by recessing the pixel definition layer 6 at the third recessed sections 23 and etching the pixel definition layer 6 at those positions. In an embodiment of this disclosure, the first recessed sections 19 are formed by recessing the pixel definition layer 6 at the third recessed sections 23, and etching the pixel definition layer 6 at those positions so that the second recessed sections can be formed with a significant depth to thereby facilitate subsequent formation of the electrically conductive sections 11.

It shall be noted that in an embodiment of this disclosure, the second recessed sections 22 can be formed at the cathode layer 10 particularly by etching the pixel definition layer 6, or etching the passivation layer 3, or etching both the pixel definition layer 6 and the passivation layer 3. Since the pixel definition layer 6 and the passivation layer 3 are generally thicker than other layers, the pixel definition layer 6 and the passivation layer 3 can be etched to thereby form the recesses with a significant depth so that the corresponding recesses can be formed at the corresponding positions after the other layers are subsequently formed, and the second recessed sections 22 can be formed at the cathode layer 10. Since the other layers (e.g., the organic function layer) are relatively thin, they cannot be etched to thereby form recesses with a significant depth. Furthermore in an embodiment of this disclosure, the second recesses 22 are formed at the cathode layer 10 to accommodate the electrically conductive sections 11, so that on one hand, the electrically conductive sections 11 can be formed on the surface of the cathode layer 10 through inkjet printing without increasing the number of times that a mask is used; and on the other hand, the organic function layer 9 and the cathode layer 10 may be easily oxidized, easily eroded by water and oxygen, etc., so the electrically conductive sections 11 can be formed without damaging the organic function layer 9 and the cathode layer 10 if the electrically conductive sections 11 are formed on the organic function layer 9 and the cathode layer 10 in an etching process.

In a particular implementation, as illustrated in FIG. 1 to FIG. 3, the thickness of the electrically conductive sections 11 is equal to the depth of the second recessed sections 22. In an embodiment of this disclosure, the thickness of the electrically conductive sections 11 is equal to the depth of the second recessed sections 22, that is, the surfaces of the electrically conductive sections 11 are flush with the upper surface of the surrounding cathode layer 10 to thereby facilitate a subsequent contact with an assistant cathode layer of a second substrate.

In a particular implementation, the resistivity of the electrically conductive sections 11 in an embodiment of this disclosure may be smaller than or equal to the resistivity of the cathode layer, that is, the resistivity of the electrically conductive sections 11 is not larger than the resistivity of the cathode layer 10. For example, the material of the electrically conductive sections 11 particularly can be nanometer silver. The resistivity of the electrically conductive sections 11 in an embodiment of this disclosure is smaller than or equal to the resistivity of the cathode layer, and since the resistance of the electrically conductive sections 11 is smaller than the resistance of the cathode layer 10, the resistance of the cathode layer can be reduced in effect. The material of the electrically conductive sections 11 is nanometer silver, and the electrically conductive sections 11 particularly can be formed in the second recessed sections 22 through inkjet printing.

In a particular implementation, the material of the electrically conductive sections 11 in an embodiment of this disclosure can alternatively be PEDOT/PSS or poly(3,4-ethylenedioxythiophene)/poly(styrenesulfonate). When the material of the electrically conductive sections 11 is PEDOT/PSS or poly(3,4-ethylenedioxythiophene)/poly(styrenesulfonate), they particularly can be formed in the second recessed sections 22 through inkjet printing.

Figure 4:
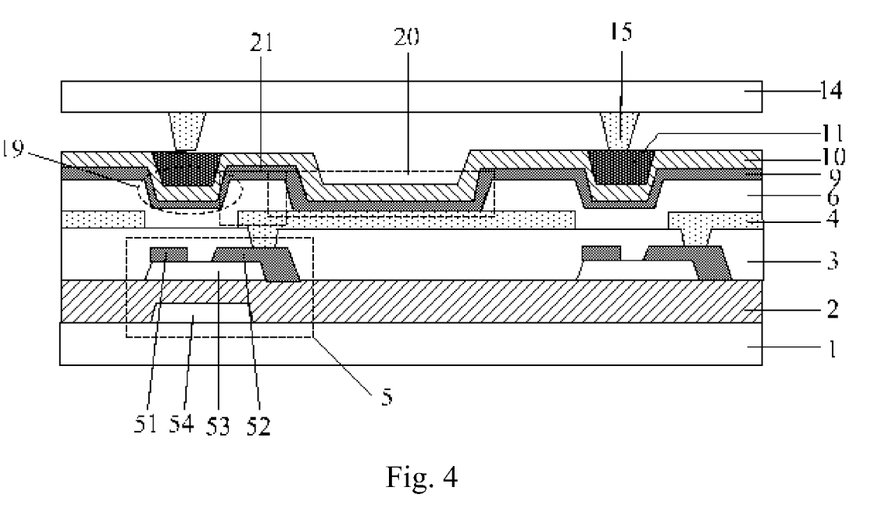
FIG. 4 is a schematic structural diagram of the OLED display panel including a second substrate including spacers according to an embodiment of this disclosure.

In a particular implementation, as illustrated in FIG. 4, the OLED display panel according to an embodiment of this disclosure can further include: a second substrate 14 arranged opposite to the first substrate 1, and spacers 15 located on the side of the second substrate 14 facing the first substrate 1. Normal projections of the electrically conductive sections 11 onto the first substrate 1 cover normal projections of the spacers 15 onto the first substrate 1.

Figure 5:
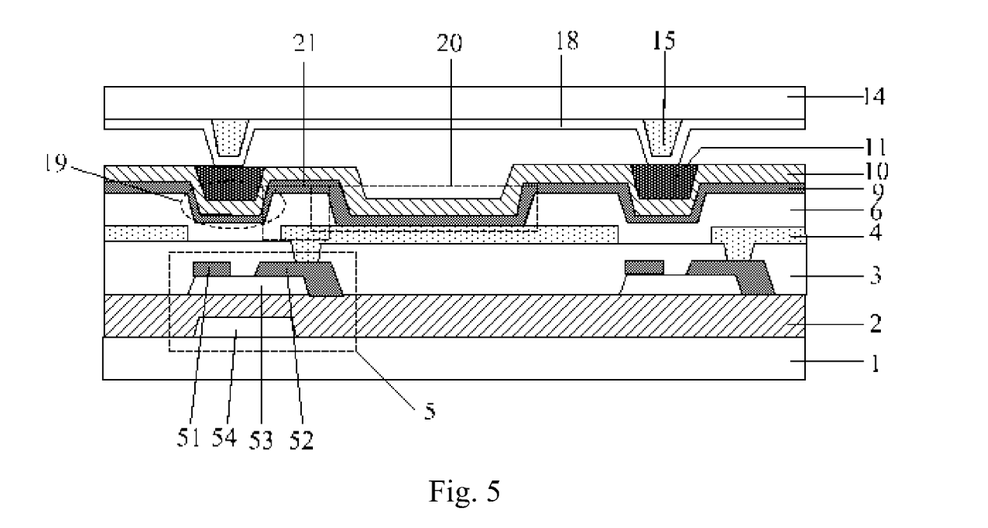
FIG. 5 is a schematic structural diagram of the OLED display panel including a second substrate including an assistant electrode layer according to an embodiment of this disclosure.

In a particular implementation, as illustrated in FIG. 5, the OLED display panel according to an embodiment of this disclosure can further include an assistant electrode layer 18 located on the faces of the spacers 15 away from the second substrate 14, where the assistant electrode layer 18 contacts with the electrically conductive sections 11 at the positions corresponding to the spacers 15. In the embodiment of this disclosure, the assistant electrode layer 18 is further arranged on the second substrate 14 to contact with the electrically conductive sections 11 and to be further connected with the cathode layer 10 to thereby further reduce the resistance of the cathode layer 10.

Figure 6:
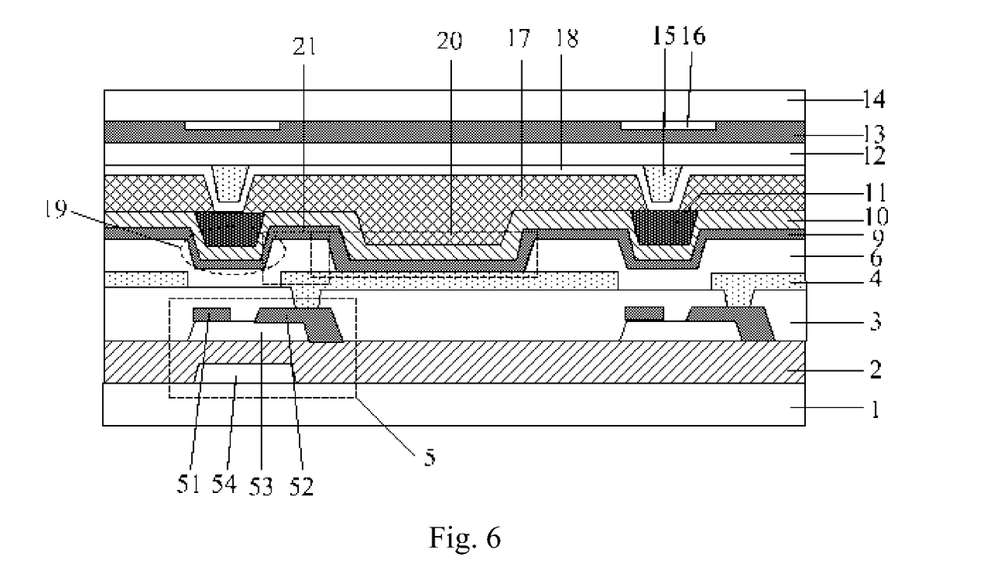
FIG. 6 is a schematic structural diagram of the OLED display panel including a second substrate including black matrixes according to an embodiment of this disclosure.

In a particular implementation, as illustrated in FIG. 6, the OLED display panel according to an embodiment of this disclosure can further include: black matrixes 16 located between the second substrate 14 and the spacers 15, a color filter layer 13 located between the black matrixes 16 and the spacers 15, a planarization layer 12 located between the color filter layer 13 and the spacers 15, and a filling layer 17 located on the side of the assistant electrode layer 18 away from the planarization layer 12. Normal projections of the black matrixes 16 onto the first substrate 1 cover the normal projections of the electrically conductive sections 11 onto the first substrate 1. In the embodiment of this disclosure, the black matrixes 16 are further arranged on the second substrate 14, and the normal projections of the black matrixes 16 onto the first substrate 1 cover the normal projections of the electrically conductive sections 11 onto the first substrate 1, that is, the electrically conductive sections 11 is located in a non-display area so that the transmittivity of the display area will not be degraded. Furthermore, the spacers 15 are arranged on the side of the planarization layer 12 facing the cathode layer 10, and the assistant electrode layer 18 is formed on the sides of the spacers 15 and the planarization layer 12 facing the cathode layer 10, so the filling layer 17 shall be arranged between the planarization layer 12 and the cathode layer 10 to thereby planarize their contact interface between them.

An embodiment of this disclosure further provides a display device including the OLED display panel according to an embodiment of this disclosure.

Figure 7:
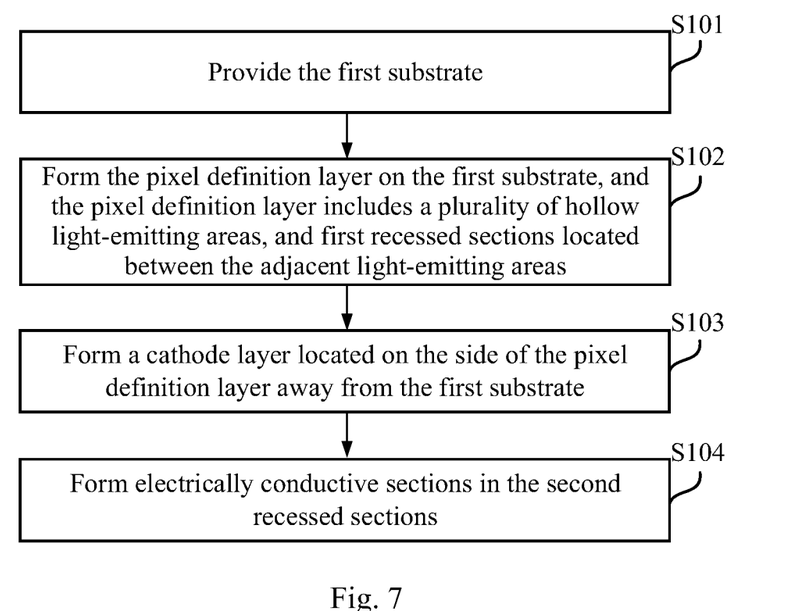
FIG. 7 is a schematic flow chart of fabricating an OLED display panel according to an embodiment of this disclosure.

As illustrated in FIG. 7, an embodiment of this disclosure further provides a method for fabricating the OLED display panel according to an embodiment of this disclosure, and the method includes the following steps.

The step S101 is to provide the first substrate.

The step S102 is to form the pixel definition layer on the first substrate, and the pixel definition layer includes the plurality of hollow light-emitting areas and the first recessed sections located between the adjacent light-emitting areas.

The step S103 is to form the cathode layer located on the side of the pixel definition layer away from the first substrate, and the cathode layer includes the corresponding second recessed sections corresponding in position to the first recessed sections.

The step S104 is to form the electrically conductive sections in the second recessed sections.

Figure 8:
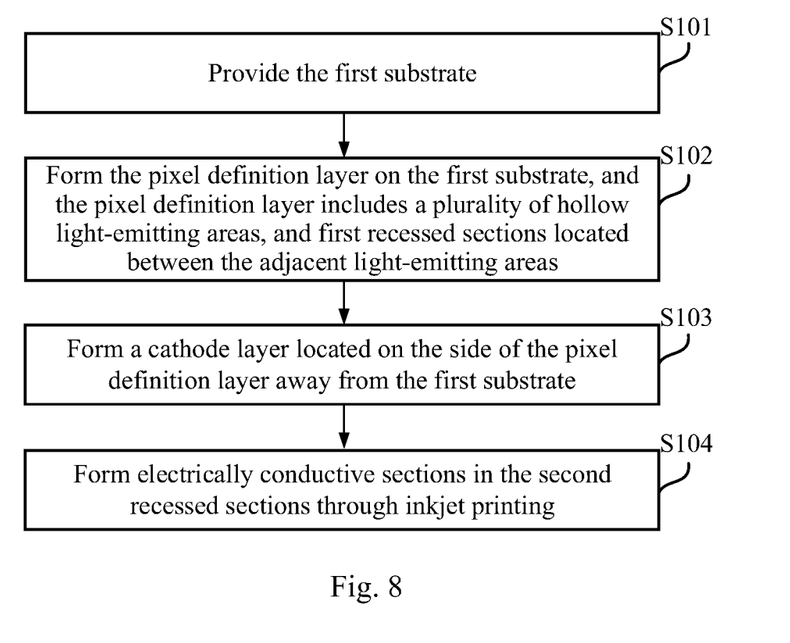
FIG. 8 is a schematic flow chart of fabricating the OLED display panel including electrically conductive sections formed through inkjet printing according to an embodiment of this disclosure.

In a particular implementation, as illustrated in FIG. 8, the step S104 of forming the electrically conductive sections in the second recessed sections in an embodiment of this disclosure particularly can include forming the electrically conductive sections in the second recessed sections in an inkjet printing process. In the embodiment of this disclosure, the electrically conductive sections are formed in the second recessed sections in an inkjet printing process so that on one hand, the electrically conductive sections can be formed without increasing the number of times that a mask is used; and on the other hand, the organic function layer and the cathode layer may be easily oxidized, easily eroded by water and oxygen, etc., so the electrically conductive sections can be formed without damaging the organic function layer and the cathode layer if the electrically conductive sections are formed on the organic function layer and the cathode layer in an etching process.

Figure 9:
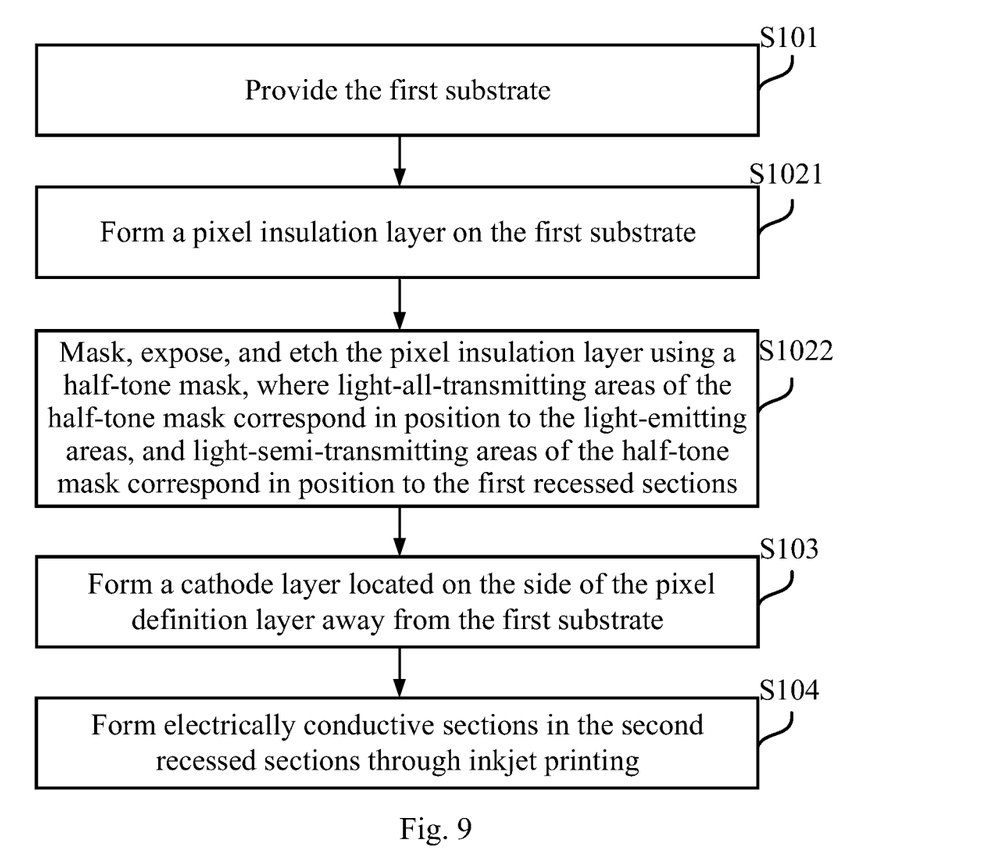
FIG. 9 is a schematic flow chart of fabricating an OLED display panel including a pixel definition layer formed in a half-tone mask process according to an embodiment of this disclosure.

In a particular implementation, as illustrated in FIG. 9, the step S102 of forming the pixel definition layer on the first substrate in an embodiment of this disclosure particularly can include the following steps.

The step S1021 is to form a pixel insulation layer on the first substrate. The pixel insulation layer is the pixel definition layer before being patterned, and particularly can be made of insulation layer resin. The thickness of the pixel definition layer ranges from 2 μm to 20 μm.

The step S1022 is to mask, expose, and etch the pixel insulation layer using a half-tone mask, where light-all-transmitting areas of the half-tone mask correspond in position to the light-emitting areas, and light-semi-transmitting areas of the half-tone mask correspond in position to the first recessed sections. In an embodiment of this disclosure, the pixel definition layer is formed in a half-tone mask process so that the first recessed sections can be formed while the light-emitting areas of the pixel definition layer are being formed, to thereby simplify a process of fabricating the OLED display panel.

In order to make the method for fabricating the OLED display panel according to an embodiment of this disclosure more apparent, the method for fabricating the OLED display panel according to an embodiment of this disclosure will be described below in details by way of an example with reference to FIG. 10 to FIG. 13, and the method includes the following particular steps.

Figure 10:
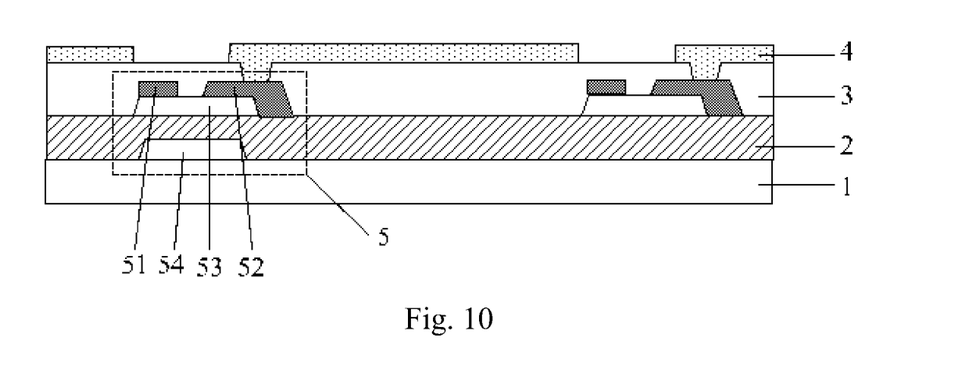
FIG. 10 is a schematic structural diagram of the OLED display panel after anodes are formed according to an embodiment of this disclosure.

The step a is to form gates 54, a gate insulation layer 2, an active layer 53, sources 51, drains 52, a passivation layer 3, and anodes 4 on the first substrate 1 in that order in corresponding processes. FIG. 10 illustrates the structure after the anodes 4 are formed.

Figure 11:
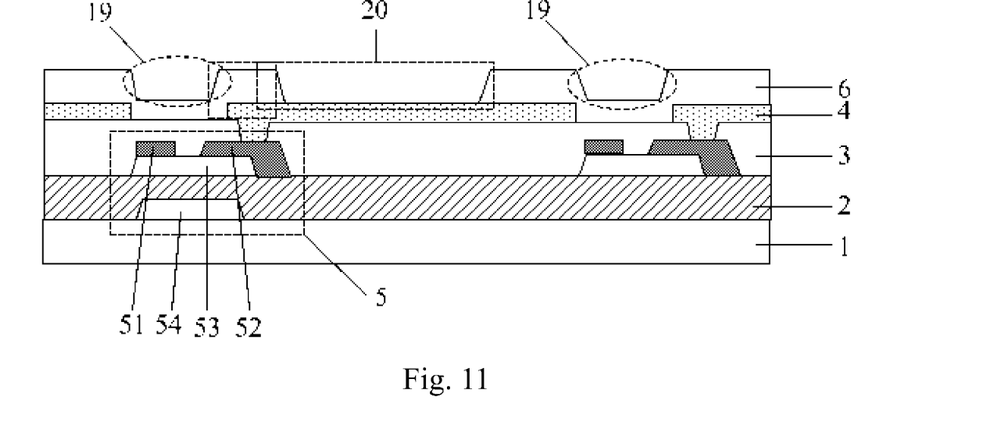
FIG. 11 is a schematic structural diagram of the OLED display panel after a pixel definition layer is formed according to an embodiment of this disclosure.

After the step a is performed, the step b is to coat the pixel insulation layer on the anodes 4, and to mask, expose, etch, develop, etc., the pixel insulation layer using the half-tone mask to form the pixel definition layer 6 including the light-transmitting areas 20 and the second recessed sections 19. FIG. 11 illustrates the structure after the pixel definition layer 6 is formed. The light-all-transmitting areas of the half-tone mask correspond in position to the light-emitting areas 20, and the light-semi-transmitting areas of the half-tone mask correspond in position to the first recessed sections 19, that is, semi-through-holes (i.e., the first recessed sections 19) are formed at the pixel definition layer 6 at the positions corresponding to to-be-formed black matrixes 16 using a semi-transmitting mask, and all-through-holes are formed at the pixel definition layer 6 at the positions corresponding to the light-emitting areas 20. The transmittivity of the mask at the semi-through-holes can be approximately 40%, and the transmittivity of the mask at the all-through-holes can be 100%.

Figure 12:
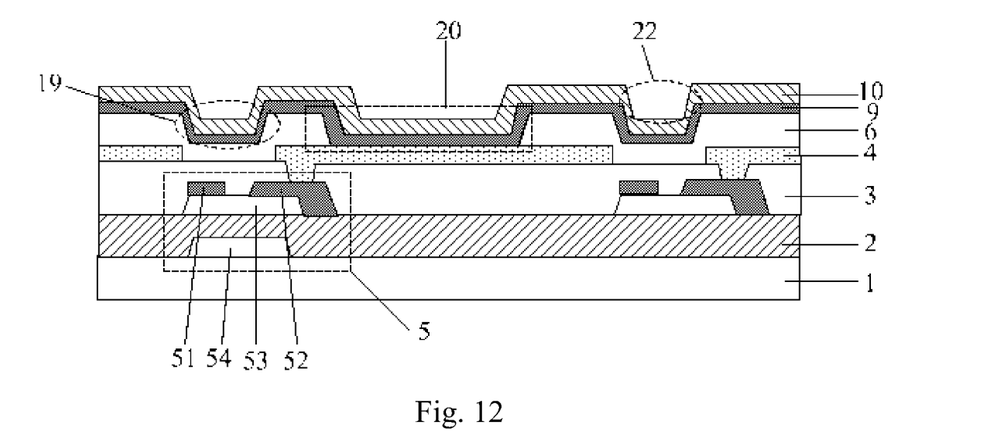
FIG. 12 is a schematic structural diagram of the OLED display panel after cathodes are formed according to an embodiment of this disclosure.

After the step b is performed, the step c is to form an organic function layer 9 and the cathode layer 10 in corresponding processes. FIG. 12 illustrates the structure after the cathode layer 10 is formed. The organic function layer 9 includes at least one of a hole injection layer, a hole transmission layer, a light-emitting layer, a hole blocking layer, an electron blocking layer, an electron transmission layer, or an electron injection layer. The cathode layer 10 particularly can be a transparent metal layer.

It shall be noted that in this step, fourth recessed sections are formed at the organic function layer 9 at the positions corresponding to the first recessed sections 19 at the pixel definition layer 6, and the fourth recessed sections at the organic function layer 9 are located in the first recessed sections. The second recessed sections 22 are formed at the cathode layer 10 at the positions corresponding to the fourth recessed sections at the organic function layer 9, and the second recessed sections 22 at the cathode layer 10 are located in the fourth recessed sections at the organic function layer 9.

Figure 13:
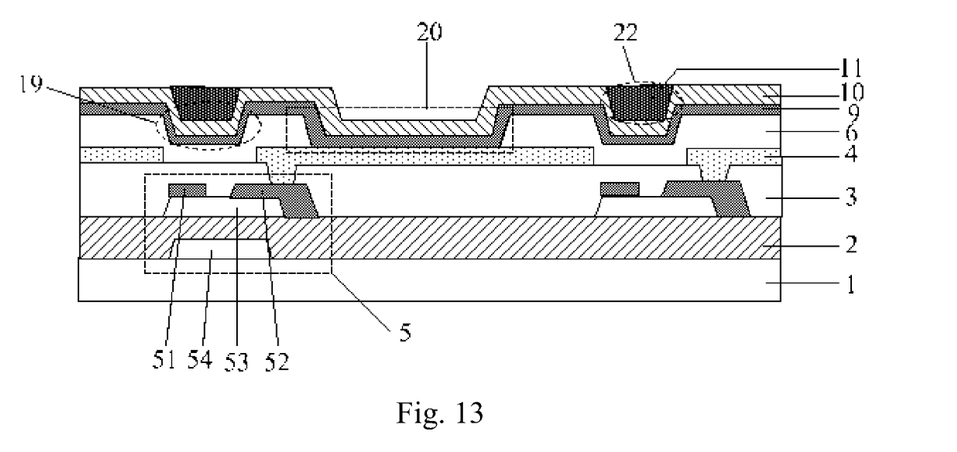
FIG. 13 is a schematic structural diagram of the OLED display panel after electrically conductive sections are formed according to an embodiment of this disclosure.

After the step c is performed, the step d is to form the electrically connective sections 11 by filing an electrically conductive material in the second recessed sections 22 through inkjet printing as illustrated in FIG. 13.

Moreover, a second substrate 14 formed with the black matrixes 16, a color filter layer 13, a planarization layer 12, etc., can be prepared in a traditional process, and aligned with the first substrate 1 prepared as described above to thereby fabricate the OELD display panel.

Evidently those skilled in the art can make various modifications and variations to the disclosure without departing from the spirit and scope of the disclosure. Thus, the disclosure is also intended to encompass these modifications and variations thereto so long as the modifications and variations come into the scope of the claims appended to the disclosure and their equivalents.

The invention claimed is:

1. An OLED display panel, comprising:
   a first substrate;
   a pixel definition layer located on the first substrate, the pixel definition layer comprising a plurality of hollow light-emitting areas, and first recessed sections located between adjacent light-emitting areas;
   a cathode layer located on a side of the pixel definition layer away from the first substrate, the cathode layer comprising corresponding second recessed sections corresponding in position to the first recessed sections;
   electrically conductive sections located on a side of the cathode layer away from the pixel definition layer, and located in the second recessed sections;
   a second substrate arranged opposite to the first substrate; and
   spacers located on a side of the second substrate facing the first substrate;
   wherein normal projections of the electrically conductive sections onto the first substrate cover normal projections of the spacers onto the first substrate.

2. The OLED display panel according to claim 1, wherein the first recessed sections are formed by etching the pixel definition layer.

3. The OLED display panel according to claim 2, wherein the pixel definition layer further comprises blocking sections located between the first recessed sections and the light-emitting areas; and
   a depth of the first recessed sections is a half of a thickness of the blocking sections.

4. The OLED display panel according to claim 1, wherein the OLED display panel further comprises a passivation layer located between the first substrate and the pixel definition layer;
   there are third recessed sections at the passivation layer at positions corresponding to the first recessed sections; and
   the first recessed sections are formed by recessing the pixel definition layer at the third recessed sections.

5. The OLED display panel according to claim 1, wherein the OLED display panel further comprises a passivation layer located between the first substrate and the pixel definition layer;
   there are third recessed sections at the passivation layer at positions corresponding to the first recessed sections; and
   the first recessed sections are formed by recessing the pixel definition layer at the third recessed sections, and etching the pixel definition layers at the positions.

6. The OLED display panel according to claim 5, wherein the OLED display panel further comprises:
   thin film transistors located between the first substrate and the passivation layer;

anodes located between the passivation layer and the pixel definition layer; and an organic function layer located between the pixel definition layer and the cathode layer.

7. The OLED display panel according to claim 1, wherein a thickness of the electrically conductive sections is equal to a depth of the second recessed sections.

8. The OLED display panel according to claim 1, wherein a resistivity of the electrically conductive sections is not larger than a resistivity of the cathode layer.

9. The OLED display panel according to claim 8, wherein a material of the electrically conductive sections comprises nanometer silver.

10. The OLED display panel according to claim 1, wherein a material of the electrically conductive sections comprises PEDOT/PSS or poly(3,4-ethylenedioxythiophene)/poly(styrenesulfonate).

11. The OLED display panel according to claim 1, wherein the OLED display panel further comprises an assistant electrode layer on sides of the spacers away from the second substrate; and the assistant electrode layer contacts with the electrically conductive sections at positions corresponding to the spacers.

12. The OLED display panel according to claim 11, wherein the OLED display panel further comprises:

black matrixes located between the second substrate and the spacers;

a color filter layer located between the black matrix and the spacers;

a planarization layer located between the color filter layer and the spacers; and a filling layer located on a side of the assistant electrode layer away from the planarization layer;

normal projections of the black matrixes onto the first substrate cover normal projections of the electrically conductive sections onto the first substrate.

13. A display device, comprising an OLED display panel, the OLED display panel comprising:

a first substrate;

a pixel definition layer located on the first substrate, the pixel definition layer comprising a plurality of hollow light-emitting areas, and first recessed sections located between adjacent light-emitting areas;

a cathode layer located on a side of the pixel definition layer away from the first substrate, the cathode layer comprising corresponding second recessed sections corresponding in position to the first recessed sections;

electrically conductive sections located on a side of the cathode layer away from the pixel definition layer, and located in the second recessed sections;

a second substrate arranged opposite to the first substrate; and spacers located on a side of the second substrate facing the first substrate;

wherein normal projections of the electrically conductive sections onto the first substrate cover normal projections of the spacers onto the first substrate.

14. A method for fabricating an OLED display panel, wherein the OLED display panel comprises:

a first substrate;

a pixel definition layer located on the first substrate, the pixel definition layer comprising a plurality of hollow light-emitting areas, and first recessed sections located between adjacent light-emitting areas;

a cathode layer located on a side of the pixel definition layer away from the first substrate, the cathode layer comprising corresponding second recessed sections corresponding in position to the first recessed sections;

electrically conductive sections located on a side of the cathode layer away from the pixel definition layer, and located in the second recessed sections;

a second substrate arranged opposite to the first substrate; and spacers located on a side of the second substrate facing the first substrate;

wherein normal projections of the electrically conductive sections onto the first substrate cover normal projections of the spacers onto the first substrate; and, wherein the method comprises:

providing the first substrate;

forming the pixel definition layer on the first substrate, the pixel definition layer comprising the plurality of hollow light-emitting areas, and the first recessed sections located between the adjacent light-emitting areas;

forming the cathode layer located on the side of the pixel definition layer away from the first substrate, wherein the cathode layer comprises the corresponding second recessed sections corresponding in position to the first recessed sections; and forming the electrically conductive sections in the second recessed sections.

15. The method according to claim 14, wherein forming the pixel definition layer on the first substrate comprises:

forming the pixel definition layer on the first substrate through inkjet printing.

16. The method according to claim 15, wherein forming the pixel definition layer on the first substrate comprises:

forming a pixel insulation layer on the first substrate; and masking, exposing, and etching the pixel insulation layer using a half-tone mask, wherein light-all-transmitting areas of the half-tone mask correspond in position to the light-emitting areas, and light-semi-transmitting areas of the half-tone mask correspond in position to the first recessed sections.

* * * * *